Jan. 16, 1968 M. P. SCHREINER 3,364,440

INVERTER CIRCUITS

Filed March 31, 1965 2 Sheets-Sheet 1

INVENTOR
Max P. Schreiner

BY John G. Graham

ATTORNEY

INVENTOR.
Max P. Schreiner
BY
John D. Graham

United States Patent Office 3,364,440

Patented Jan. 16, 1968

3,364,440

INVERTER CIRCUITS

Max P. Schreiner, Richardson, Tex., assignor to Texas Instruments Incorporated, Dallas, Tex., a corporation of Delaware Filed Mar. 31, 1965, Ser. No. 444,278
6 Claims. (Cl. 331—111)

This invention relates to an electrical apparatus for converting direct current to alternating current, and more particularly to an inverter circuit using semiconductor controlled rectifiers which are switched on and off by control pulses.

It is an object of this invention to provide an improved inverter which uses a minimum of components and which is variable in frequency. Another object is to provide a variable frequency DC to alternating current inverter which utilizes a PNPN controlled rectifier.

In accordance with one embodiment of this invention, a four terminal semiconductor on-off switch is connected in series with a DC source. The switch is periodically rendered conductive by a relaxation circuit including a resistance-capacitance arrangement connected to the DC source, the capacitor being coupled to one gate of the switch by a threshold trigger device. The switch is turned off by discharging a capacitor in the cathode circuit through a second gate of the device.

The novel features believed to be characteristic of this invention are set forth in the appended claims. The invention itself, however, along with further objects and advantages thereof, may be best understood by reference to the following detailed description of an illustrative embodiment, when read in conjunction with the accompanying drawings, wherein:

Figures 1, 2, 3A, 3B:
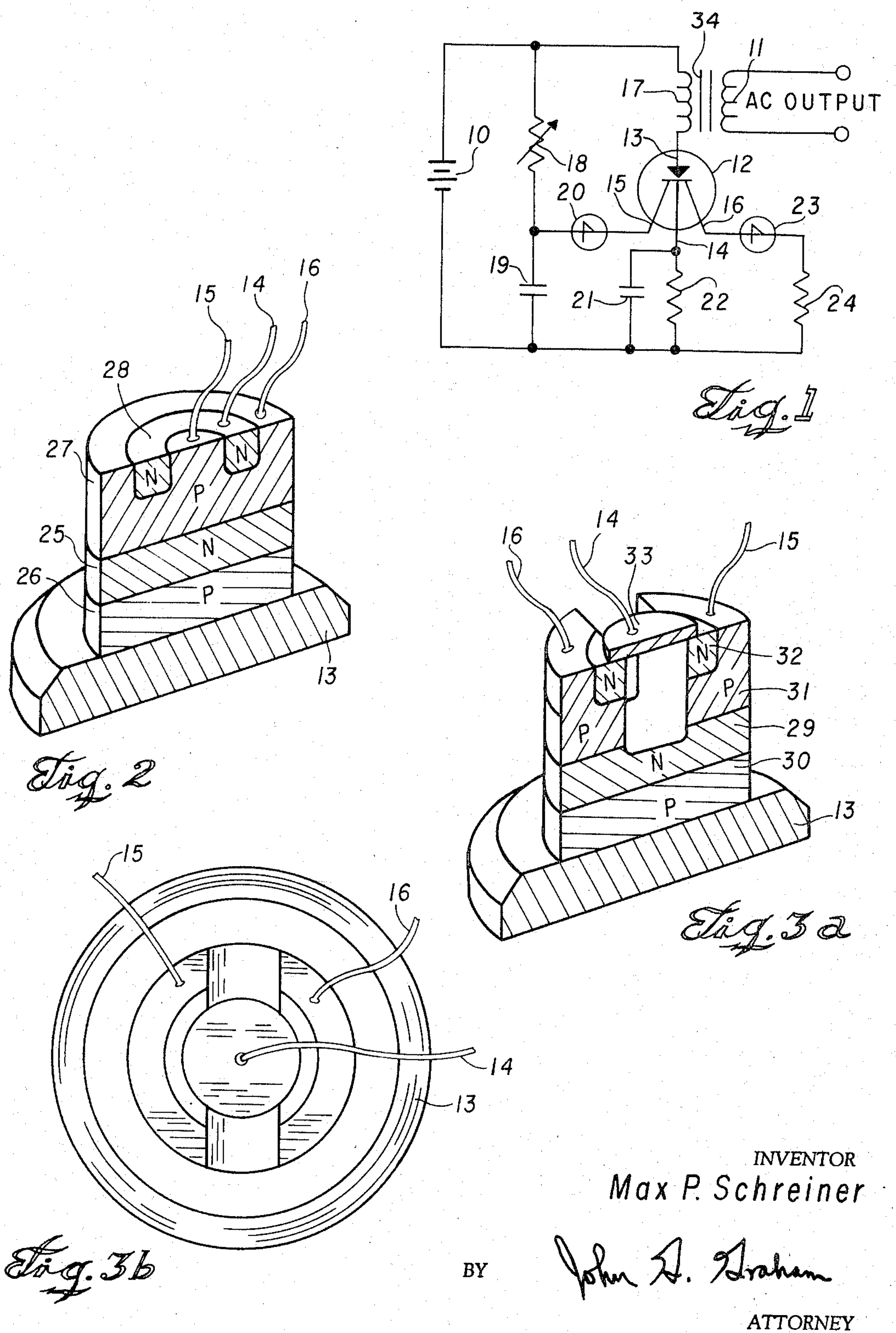
FIGURE 1 is a schematic diagram of an inverter circuit utilizing the principal features of the invention.
FIGURE 2 is a pictorial view in section of a semiconductor switch for use in the circuit of FIGURE 1.

FIGURE 3*a* is a pictorial view in section of another semiconductor device for use in the circuit of FIGURE 1;

FIGURE 3*b* is a top view of the device shown in FIGURE 3*a*;

FIGURES 4*a*–4*e* represent voltage or current waveforms appearing at various points in the circuit of FIGURE 1.

With reference to FIGURE 1, an inverter is illustrated for converting a direct voltage provided by a source 10 to an alternating current voltage at an output 11. The active element of the inverter is a four-terminal semiconductor switch 12, which has the usual anode and cathode 13 and 14, respectively, but which is provided with two gates 15 and 16 rather than only one, as would be provided in a conventional silicon controlled rectifier, for example. The switch, to be described in detail below, may be turned on by a current pulse applied to the gate 15 and turned off with a current pulse out of the gate 16. The anode-cathode path of the switch 12 is connected in a closed series circuit with the DC source and must be turned on and off periodically to provide alternating current to the load (not shown) connected to the secondary 11 of transformer 34. Current pulses are provided to the gate 15 to turn on the switch by a relaxation circuit including a resistor 18 and a capacitor 19 connected across the DC source 10 along with a four-layer trigger diode 20 such as a conventional PNPN diode connecting the capacitor 19 to the gate 15. The switch 12 is turned off by a combination of elements including a capacitor 21 in the cathode circuit, shunted by a resistor 22, along with an impedance arrangement in the second gate circuit which may include another four-layer diode 23 and a resistor 24. Detecting means, such as transformer 34, has primary winding 17 connected in series with the anode 13 to reflect the on-off condition of the switch 12 and the secondary winding 11 is available for use as output terminals for the alternating current.

A four-terminal semiconductor switch adapted for use in the circuit shown in FIGURE 1 is illustrated in FIGURE 2. The switch includes a semiconductor wafer 25 of a first conductivity-type (N-type, for example) with surface layers 26 and 27 of P-conductivity type. A region 28 of N-conductivity type is formed in surface layer 27, for example as by diffusion, to serve as the cathode of the switch. FIGURE 2 is merely illustrative of how the gate region of such a switch, in this instance layer 27, is divided into two areas, i.e., the surface portion of layer 27 which is interior to the region 28 and the surface portion of layer 27 which is exterior to the region 28. The switch could be of the polarity as illustrated, or the layers 25 and 28 could be P-conductivity type and the layers 26 and 27 N-conductivity type, provided the polarity of the trigger diodes 20 and 23 and the rest of the FIGURE 1 circuit are adjusted therefor. It should be appreciated that while switches of this type may be constructed of monocrystalline silicon, they may be likewise fabricated from germanium or other available semiconductor materials.

Another embodiment of a semiconductor switch adapted for use in the circuit shown in FIGURE 1 is illustrated in FIGURES 3*a* and 3*b*. This switch is likewise merely illustrative of a switch which will make operative the inverter circuit.

Said switch includes a semiconductor wafer 29 of a first conductivity type (N-type, for example) with surface layers 30 and 31 of conductivity P-type. A region 32 of N-type is formed in the surface layer 31, for example as by diffusion, to serve as the cathode of the switch. A portion of the three top layers 29, 31 and 32 is tunneled out to produce in layer 31 two separate regions which are used as the two gate regions of the switch. Layer 32 is also divided into two regions but effectively acts as one region when a metallized contact layer 33 is used to bridge the tunneled out area. FIGURE 3*b* illustrates a top view of the same switch. As with the switch shown in FIGURE 2, the switch of FIGURES 3*a* and 3*b* may be of the conductivity type as illustrated, or the conductivity types of the respective layers may be each of the opposite conductivity type. It should likewise be appreciated that the switch may be fabricated from monocrystalline silicon, germanium or any other available semiconductor material.

It is to be emphasized that the switches of FIGURES 2, and 3*a* and 3*b* are merely illustrative of a four-terminal switch which will be operative in the circuit of the present invention. Any four-terminal, two-gated device is included in the present scope of the circuit of FIGURE 1. In brief, the operation of the two-gated controlled rectifier switch includes the operation of the usual single gate-controlled switch, whereby a current pulse applied to the gate while the cathode and anode are properly biased will render the switch conductive, thus turning the switch "on." An inherent parameter of such a device is its "holding current." Until the current in the switch is reduced below the holding current, the device will continue to conduct, even though the current trigger pulse is no longer applied to the gate. In the two-gated device used with the present circuit, the second gate is used to turn the switch "off" as explained hereinafter.

With reference to FIGURE 4, a representative group of waveforms is illustrated for the purpose of showing a typical operation of the circuit shown in FIGURE 1. In each instance, either voltage or current is plotted versus time, but neither the vertical nor horizontal axis is shown as having quantitative values, as both the magnitude of the current or voltage and the frequency of the alternating current output are subject to many variables. For example, the voltage appearing across capacitor 19 is dependent upon the magnitude of the voltage source 10, and the rate at which this voltage appears at the capacitor is dependent upon the ohmic size of resistor 18. Of course, this resistor 18 could be of the fixed ohmic value, but is shown as being variable in order to vary the charge rate of the voltage across capacitor 19, and thus the frequency of the alternating current available from the secondary winding 11 of the transformer 34.

Figure 4A:
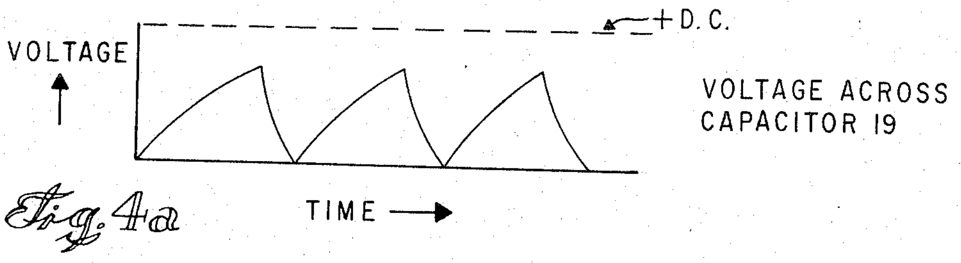
Figure 4B:
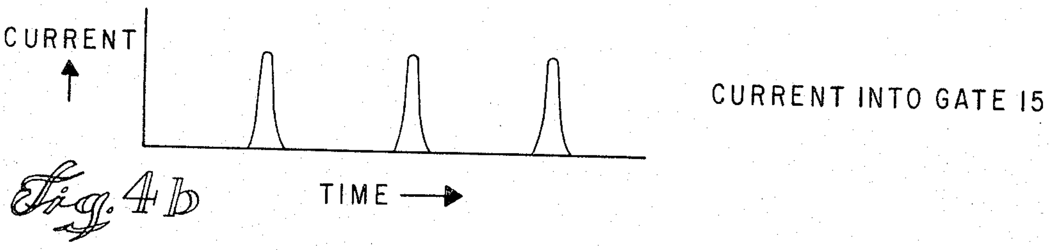
Figure 4C:
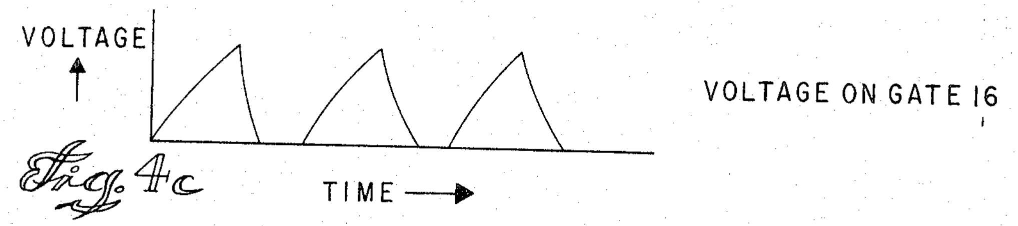
Figure 4D:
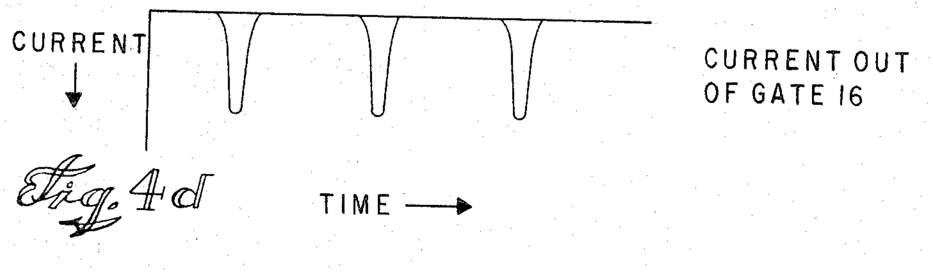
Figure 4E:
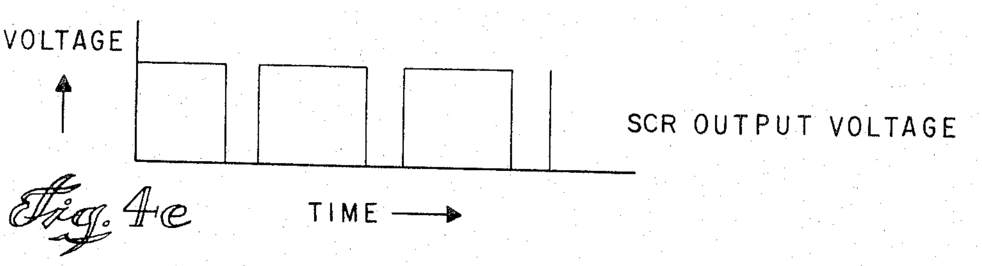

The operation of the circuit, considered as beginning from time zero in FIGURE 4*a* is as follows: Voltage source 10 is applied across resistor 18 and capacitor 19. The voltage developed across capacitor 19 is a function of the RC time constant and will continue to rise until the trigger voltage of the diode 20 is reached. When diode 20 is triggered, capacitor 19 is discharged into the gate 15 of the switch 12 and produces a gate current pulse, as shown in FIGURE 4*b*. This pulse causes the switch 12 to be turned on and would continue in the "on" conduction state except for the circuit elements capacitor 21, resistor 22 and 24, and trigger diode 23. As capacitor 21 becomes charged, subject to the RC time constant of capacitor 21 and resistor 22, the voltage on gate 16 increases until the trigger voltage of the diode 23 is reached, as shown in FIGURE 4*c*. When the diode 23 is triggered, a current pulse is discharged out of gate 16, as illustrated in FIGURE 4*d*. This outgoing current pulse turns the switch 12 "off" and completes the cycle of the pulsating direct current waveform, as illustrated in FIGURE 4*e*. Thus it is seen that the repetition rate of pulse production at the output side of transformer 34 is controlled by the time constant due to resistor 18 and capacitor 19, while the "on" time of the switch 12 is controlled by the time constant due to capacitor 21 and resistor 22. The resistor 24 is in the circuit as a current limiting device to control the amount of current going out through gate 16 and the trigger diode 23.

Having described the invention in connection with a certain specific embodiment thereof, it is to be understood that further modifications will suggest themselves to those skilled in the art and it is intended that such modifications are covered as fall within the scope of the appended claims.

What is claimed is:

1. An inverter circuit comprising:

(a) a semiconductor switch having a first gate and a second gate, an anode and a cathode;

(b) a source of direct current in series with said anode and cathode;

(c) a capacitor and resistor connected in serial combination, said combination being connected directly across said source of direct current;

(d) a trigger diode connected between said first gate and the point of connection between said capacitor and said resistor, thereby to operate in combination with said source of direct current to create a current pulse to render said switch conductive;

(e) means connected in series with the cathode of said switch responsive to the operation of said switch for rendering said switch nonconductive by a current pulse through said second gate and said means, and (f) output detector means in series with said switch responsive to the conductive and nonconductive state of said switch to produce alternating current.

2. The circuit according to claim 1 wherein said resistor is variable to thereby make variable the frequency of said alternating current.

3. The circuit according to claim 2 wherein said trigger diode is a PNPN semiconductor diode.

4. The circuit according to claim 1 wherein said means connected in series with said cathode of said switch is a capacitor and a resistor in RC parallel combination.

5. An inverter circuit comprising:

(a) a semiconductor switch having a first gate and a second gate, an anode and cathode;

(b) a source of direct current in series with said anode and cathode;

(c) a resistor-capacitor combination across said source of direct current and connected to said first gate for rendering said switch conductive by applying a current pulse thereto;

(d) a trigger diode and resistive element connected between said second gate and one end of said source;

(e) a capacitor and a resistor in RC parallel combination, said combination being connected between said cathode and said one end of said source thereby to provide an RC network to control the conduction time of said switch; and (f) a transformer connected between said anode and another end of said source responsive to the conductive and non-conductive states of said switch to produce alternating current.

6. The circuit according to claim 5 wherein said trigger diode is a PNPN semiconductor diode.

References Cited

UNITED STATES PATENTS

| | | | |
|---|---|---|---|
| 3,085,165 | 4/1963 | Schaffert et al. | 307—88.5 |
| 3,097,335 | 7/1963 | Schmidt | 307—88.5 X |
| 3,184,665 | 5/1965 | Wright | 307—88.5 X |
| 3,197,716 | 7/1965 | Wright et al. | 307—88.5 X |

FOREIGN PATENTS

| | | |
|---|---|---|
| 1,334,670 | 7/1963 | France. |

ARTHUR GAUSS, *Primary Examiner.*

J. ZAZWORSKY, *Assistant Examiner.*